United States Patent [19]

Mori et al.

[11] Patent Number: 4,853,313

[45] Date of Patent: Aug. 1, 1989

[54] PRINTING PLATE

[75] Inventors: Yoichi Mori, Otsu; Shigeo Abiko, Moriyama; Mikio Tsuda, Ohmihachiman; Chikara Ichijo, Kyoto, all of Japan

[73] Assignee: Toray Industries, Inc., Tokyo, Japan

[21] Appl. No.: 37,222

[22] Filed: Apr. 10, 1987

[30] Foreign Application Priority Data

Apr. 11, 1986 [JP] Japan ................................ 61-82244
May 28, 1986 [JP] Japan ............................... 61-121277

[51] Int. Cl.$^4$ ........................ G03C 1/74; G03C 1/54; G03F 7/08
[52] U.S. Cl. .................................. 430/156; 430/152; 430/165; 430/166; 430/303
[58] Field of Search ............... 430/156, 166, 303, 152, 430/165

[56] References Cited

U.S. PATENT DOCUMENTS

| | | | |
|---|---|---|---|
| 3,466,172 | 9/1969 | Skarvinko | 430/152 |
| 3,649,283 | 3/1972 | Christenson et al. | 430/166 |
| 3,728,123 | 4/1973 | Gipe | 96/75 |
| 4,210,569 | 7/1980 | Sysjuk et al. | 430/512 |
| 4,217,407 | 8/1980 | Watanabe et al. | 430/166 |
| 4,342,820 | 8/1982 | Kinashi et al. | 430/303 |
| 4,358,522 | 11/1982 | Fujita et al. | 430/303 |
| 4,496,647 | 1/1985 | Kawabe et al. | 430/303 |
| 4,504,566 | 3/1985 | Dueber | 430/166 |
| 4,557,996 | 12/1985 | Aoyama et al. | 430/324 |
| 4,571,374 | 2/1986 | Vikoslanl | 430/166 |
| 4,690,886 | 1/1987 | Naritomi et al. | 430/303 |

FOREIGN PATENT DOCUMENTS

| | | | |
|---|---|---|---|
| 0087582 | 9/1983 | | |
| 58-133108 | 2/1985 | Japan | 430/191 |
| 511560 | 8/1976 | U.S.S.R. | 430/191 |
| 850954 | 10/1960 | United Kingdom | 430/152 |
| 2034911 | 6/1980 | United Kingdom | |

OTHER PUBLICATIONS

Chemical Abstracts, vol. 94, 1981 Mar., No. 5, Columbus, Ohio, U.S.A.
IBM Technical Disclosure Bulletin, vol. 15, No. 1, Jun. 1972., Resist Process, R. S. Horst, L. H. Kaplan and D. P. Merritt, p. 46.
English Language Abstract of Japanese Publication #59-69751 published 4/1984.

*Primary Examiner*—Charles L. Bowers, Jr.
*Attorney, Agent, or Firm*—Scully, Scott Murphy & Presser

[57] ABSTRACT

A printing plate formed of a substrate and laminated thereon in the following order a primer layer and a photosensitive layer containing a quinonediazide compound and a silicone rubber layer, wherein the primer layer contains 0.1 to 25% by weight of a quinonediazide group. The printing plate of the present invention is excellent in dot reproduction, hardly causes cracking in the photosensitive layer, and has a wide latitutde in production.

10 Claims, No Drawings

PRINTING PLATE

BACKGROUND OF THE INVENTION

1. Field of the Invention

This invention relates to a printing plate which enables printing without use of dampening water.

2. Description of the Prior Art

Heretofore, a number of proposals have been made on printing plates comprising a silicone rubber layer as an ink repellent layer and thus enabling printing without use of water. For example, U.S. Pat. No. 4,358,522 discloses a printing plate having a silicone rubber layer provided on a photosolubilizable photosensitive layer comprising a quinonediazide compound backed with an aluminium plate through a primer layer. Further, U.S. Pat. No. 4,342,820 discloses a printing plate having a silicone rubber layer provided on a photosensitive layer comprising a product of partial esterification of 1,2-naphthoquinone-2-diazide-5-sulfonyl chloride with a phenolic novolak resin crosslinked with a polyfunctional isocyanate compound. In such printing plates, it is a common practice to provide a primer layer between a substrate and a photosensitive layer for the purpose of preventing halation, ensuring the adhesion between the substrate and the photosensitive layer, binding the substrate through incorporation of a primer layer containing fine particles or the like.

Although the conventional printing plates having the above-mentioned structures are useful, they have the following problems.

(1) An increase in the thickness of the photosensitive layer leads to a poor developability. On the other hand, as the thickness is decreased, the light absorbance of the photosensitive layer is decreased, which brings about transmission of an exposure light through the photosensitive layer and reflection of the transmitted light on the substrate or primer layer in the case of longer imagewise exposure time, which brings about halation and finally leads to a poor dot reproduction. The addition of a light absorber such as an ultraviolet absorber to the primer layer or photosensitive layer is considered to be effective to solve this problem. However, such an expedient leads to no significant halation preventing effect, because it is difficult to match the absorption wavelength of the absorber with that of a quinonediazide group contained in the photosensitive layer.

(2) Since known quinonediazide compounds which have been used as the photosensitive material have a relatively low molecular weight, pinholes and, non-uniform coating, etc. tend to occur in the photosensitive layer when a photosensitive layer has a small thickness, which gives an adverse effect on the printing.

(3) The stabilization of the adhesion between the photosensitive layer and the silicone rubber layer is of importance in respect of qualities of the printing plate such as developability and scratch resistance of printing plates. However, since the adhesion between the photosensitive layer and the silicone rubber layer tends to be influenced by external conditions, qualities of the printing plate also tend to undergo changes.

SUMMARY OF THE INVENTION

An object of the present invention is to provide a printing plate which is excellent in dot reproduction as well as in image reproduction.

Another object of the present invention is to provide a printing plate having a photosensitive layer which has a high flexibility and hardly causes cracking etc.

Still another object of the present invention is to provide a printing plate having a photosensitive layer which has an improved film-forming properties, hardly causes pinholes and is wide in latitude in production.

In accordance with the present invention, there is provided a printing plate comprising a substrate and superimposed on said substrate in the following order a primer layer, a photosensitive layer containing a quinonediazide compound and a silicone rubber layer, wherein said primer layer contains 0.01 to 25% by weight of a quinonediazide group. In a preferred embodiment of the present invention, said photosensitive layer further contains an organic compound which has a boiling point of 150° C. or above and at least one bond selected from an ether bond and an ester bond in its molecule and a molecular weight of 85 to 1000.

The term "printing plate" as used in the present invention is intended to mean a printing plate before development, i.e. master or unprocessed plate, as well as a printing plate after development.

DESCRIPTION OF THE PREFERRED EMBODIMENTS

The substrate used in the present invention is not particularly limited and may be any one which is used in conventional printing plates. Examples of the substrate include plates of metals such as aluminium, iron and zinc, films of organic polymers such as polyester, polyamide and polyolefin, and composite materials prepared therefrom.

The quinonediazide group contained in the primer layer used in the present invention serves as a light absorber and exhibits a halation preventing effect. When the content of the quinonediazide group in the primer layer is too low, no satisfactory halation preventing effect can be attained, while an excessively high content of the quinonediazide group is disadvantageous from the economical point of view. Therefore, the content of the quinonediazide group is preferably 0.01 to 25% by weight, more preferably 0.05 to 10% by weight, most preferably 0.1 to 5% by weight.

Examples of the quinonediazide group include substituted or unsubstituted 1,2-benzoquinonediazide group, 1,2-naphthoquinonediazide group and 2,1-naphthoquinonediazide group. Among them 1,2- or 2,1-naphthoquinonediazide group is preferable from the standpoint of stability.

Compounds containing a quinonediazide group include compounds in which 1,2-benzoquinonediazide group is bonded through a carbon atom in the 4-position or 5-position and compounds in which 1,2-(or 2,1-)naphthoquinonediazide group is bonded through a carbon atom in the 4-position or 5-position. Among them preferred compounds include naphthoquinonediazidecarboxylic acid, naphthoquinonediazidesulfonyl halide and a product of an esterificaiton of a naphthoquinonediazidesulfonic acid with a phenolic hydroxyl group. A more preferred compound includes a product of an esterification of 1,2-(or 2,1-)naphthoquinonediazide-4-(or 5-)sulfonic acid with the following compound having a phenolic hydroxyl group.

Examples of the compound having a phenolic hydroxyl group include substituted or unsubstituted phenol, cresol, dihydroxybenzene, pyrogallol, naphthol, bisphenol A, dihydroxynaphthalene, hydroxystyrene polymer or copolymer, α-methylhydroxystyrene polymer or copolymer, phenolic resin, (e.g., phenol/formaldehyde addition condensate, cresol/formaldehyde addition condensate, phenol/acetone addition condensate, cresol/acetone addition condensate, pyrogallol/acetone addition condensate or cardanol/formaldehyde addition condensate) and polyhydroxyphenyl.

Although the above-mentioned compounds may be used alone as the primer layer, it is preferred that the primer layer contain a polymer having a crosslinked structure from the standpoint of resistance to a solvent such as a developer as well as adhesion to the substrate. Further, it is preferred that the content of an acetone-soluble component in the primer layer is 20% by weight or less. The term "acetone-soluble component" as used herein is intended to mean a component which dissolves in acetone when the material constituting the primer layer is stirred in the presence of a large excess of acetone at 25° C. for 6 hr.

It is preferred that the polymer used for the primer layer is selected from those which can form a crosslinked structure among addition polymers (e.g., polyacrylic ester derivatives, polymethacrylic ester derivatives, polystyrene derivatives, polydiene derivatives, polyethylene derivatives, polyvinylidene derivatives, polyvinyl alcohol derivatives or their copolymes), polycondensates (e.g., polyesters or polyimides), addition condensates (such as novolak resin or resol resin), amino resins (such as melamine resin or urea resin), polyethers, polythiols, polyurethanes, epoxy resins, alkyd resins, etc. It is preferred in this connection that the primer layer contain 30% by weight or more of a polymer having a glass transition point of 0° C. or below from the standpoint of the surface strength of the resulting printing plate. Preferred polymers which satisfy the above-mentioned glass transition point requirement include polyurethanes, polyesters, polyacrylic ester derivatives, polymethacrylic ester derivatives and polyvinyl alcohol derivatives, and they may be used alone or in the form of any mixture thereof. The method of crosslinking these polymers is not particularly limited and may be those which are conventionally employed. Particularly, it is preferred that the polymer is crosslinked through at least one compound selected from the group consisting of polyepoxy compounds, polyisocyanate compounds and amino resins.

Examples of the polyepoxy compound include polyethylene glycol diglycidyl ethers, polypropylene glycol diglycidyl ethers, bisphenol A diglycidyl ether and trimethylolpropane diglycidyl ether. Examples of the polyisocyanate compound include hexamethylene diisocyanate, isophorone diisocyanate, p-phenylene diisocyanate, 2,4-or 2,6-tolylene diisocyanate, 4,4'-diphenylmethane diisocyanate, polymethylenepolyphenyl isocyanate or adducts thereof. Examples of the amino resin include urea resin and melamine resin.

In order to improve the adaptability to visual inspection of the plate, a white pigment such as titanium oxide or calcium carbonate or yellow pigment may be added to the above-mentioned primer composition.

Although the thickness of the primer layer is not particularly limited, too large a thickness is disadvantageous from the standpoint of coatability as well as economy while too small a thickness is also disadvantageous from the standpoint of coatability. Therefore, the thickness of the primer layer is preferably in the range of 0.5 μm to 100 μm, more preferably in the range of 1 μm to 30 μm. A resin layer composed mainly of a polymer may also be provided between the specific primer layer according to the present invention and the substrate.

Examples of the method of incorporating a quinonediazide group in a primer layer include the following methods:

(1) A compound having a quinonediazide group is added to a primer layer composition, and the composition is then applied on a substrate to form a primer layer.

(2) A rubber component is added to a primer layer composition, and the composition is applied on a substrate to form a primer layer. A composition comprising a low-molecular compound having a quinonediazide group is applied on the primer layer, thereby causing the compound having a quinonediazide group to penetrate into the primer layer. Subsequently, a photosensitive layer composition is applied thereon to form a photosensitive layer.

(3) A rubber component is added to a primer layer composition, and the composition is applied on a substrate to form a primer layer. A photosensitive layer composition containing a high molecular compound having a quinonediazide group as well as a low-molecular compound having a quinonediazide group is then applied on the primer layer, thereby causing the low-molecular compound having a quinonediazide group to penetrate and migrate into the primer layer.

(4) A rubber component is added to a primer layer composition, and the composition is applied on a substrate to form a primer layer. A photosensitive layer composition containing a plurality of quinonediazide compounds which are different from each other in percentage esterification is then applied on the primer layer, thereby causing the quinonediazide compound having a predetermined percentage esterification to penetrate and migrate into the primer layer.

With respect to the above-mentioned methods (2), (3) and (4), the content of the rubber component in the primer layer is preferably 30% by weight or more, and the materials for the rubber component are preferably those having an average glass transition point of 0° C. or below.

Examples of the rubber component include natural rubber, polybutadiene, styrene-butadiene copolymer, nitrile rubber, acrylic rubber, polyurethane, polyester elastomer, polyamide elastomer, polyetheresteramide elastomer and polyvinyl butyral.

Examples of the quinonediazide compound contained in the photosensitive layer include the above-mentioned compounds contained in the primer layer. However, it is preferred from the standpoint of image forming properties that 50% by weight or more of the quinonediazide compounds have a molecular weight of 500 or more. Preferred compounds having a molecular weight of 500 or more include products of esterification of 1,2-naphtho-quinonediazide-4(or 5)-sulfonic acid with the following compounds having a phenolic hydroxyl group, and they may be used alone or in the form of any mixture thereof.

(1) Phenolic resins, e.g., phenol/formaldehyde addition condensate, cresol/formaldehyde addition condensate, phenol/acetone addition condensate, cresol/acetone addition condensate, pyrogallol/acetone addition condensate, cardanol/formaldehyde addition condensate or cardanol/acetone addition condensate.

(2) Substituted or unsubstituted hydroxystyrene polymers or copolymers and substituted or unsubstituted α-methylhydroxystyrene polymers or copolymers.

(3) Crosslinked products as disclosed in U.S. Pat. No. 4,342,820, e.g., those obtained by crosslinking the compounds as mentioned in the above items (1) and (2) with a polyisocyanate compound, a polyepoxy compound or the like.

The photosensitive layer may also contain other polymers and plasticizers for the purpose of improving film-forming properties and adhesion.

Although the content of the quinonediazide group in the photosensitive layer is not particularly limited, it is preferably more than 5% by weight, more preferably more than 10% by weight. Further, the content of an acetonesoluble component in the photosensitive layer is preferably 20% by weight or more from the standpoint of developability.

The composition for forming the above-mentioned photosensitive layer can be prepared by dissolving the components in a suitable organic solvent, e.g., dioxane, tetrahydrofuran, cellosolve, cellosolve acetate or dimethylformamide.

Although the thickness of the photosensitive layer is not particularly limited, too large a thickness brings about lowering in developability while too small a thickness often brings about pinholes. Therefore, the thickness of the photosensitive layer is preferably 0.3 to 10 g/m², more preferably 0.5 to 5 g/m².

The organic compounds having at least one bond selected from an ether bond and an ester bond in its molecule which may be used in the present invention are those having a high compatibility with the quinonediazide compound and capable of plasticizing the photosensitive layer.

Preferred examples of such organic compounds are represented by the following general formulae (I) and (ii):

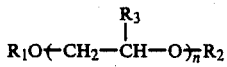

$$R_1O+CH_2-CH-O)_nR_2 \quad (I)$$

with $R_3$ on the CH

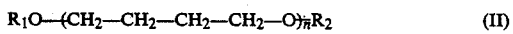

$$R_1O-(CH_2-CH_2-CH_2-CH_2-O)_nR_2 \quad (II)$$

wherein $R_1$ and $R_2$ each independently stand for a hydrogen atom, an alkyl group having 1 to 10 carbon atoms or an acyl group having 2 to 5 carbon atoms; $R_3$ a hydrogen atom or a methyl group; and n an integer of 2 to 15, and they include diethylene glycol, triethylene glycol, polyethylene glycol, dipropylene glycol, tripropylene glycol, polypropylene glycol, diethylene glycol monomethyl ether, diethylene glycol monoethyl ether, diethylene glycol monobutyl ether, diethylene glycol monohexyl ether, triethylene glycol monomethyl ether, triethylene glycol monoethyl ether, triethylene glycol monobutyl ether, diethylene glycol dimethyl ether, diethylene glycol diethyl ether, diethylene glycol dibutyl ether, triethylene glycol dimethyl ether, tetraethylene glycol dimethyl ether, polyethylene glycol dimethyl ether, diethylene glycol monomethyl ether acetate, diethylene glycol monoethyl ether acetate, diethylene glycol monobutyl ether acetate, 1,4-butanediol monohexyl ether and 1,4-butanediol dibutyl ether.

Examples of other organic compounds having an ether bond include ethylene glycol monohexyl ether and ethylene glycol dibutyl ether.

Examples of other organic compounds having an ester bond include ethylene glycol diacetate, dimethyl oxalate, diethyl oxalate, dimethyl malonate, diethyl malonate, dimethyl succinate, dimethyl adipate, diethyl adipate, dimethyl maleate, diethyl maleate, dimethyl fumarate, diethyl fumarate and propylene carbonate.

More preferred organic compounds include polyethylene glycol, polypropylene glycol, diethyl glycol dimethyl ether, diethylene glycol diethyl ether, triethylene glycol dimethyl ether, tetraethylene glycol dimethyl ether, diethylene glycol monoethyl ether acetate, dimethyl succinate, dimethyl adipate and propylene carbonate.

The molecular weight of the organic compound having at least one bond selected from an ether bond and an ester bond in its molecule is preferably 85 to 1000, more preferably 90 to 800, and the boiling point thereof is preferably 150° C. or above. A molecular weight of less than 90 and a boiling point of lower than 150° C. are unfavorable because the effect attained by its addition is small. On the other hand, a molecular weight exceeding 1000 is also unfavorable because the compatibility with the quinonediazide compound is lowered.

The content of the organic compound having at least one bond selected from an ether bond and an ester bond is 0.5 to 300 parts by weight, preferably 0.5 to 150 parts by weight per 100 parts by weight on a dry basis of the photosensitive layer. When the content is too low, the effect attained by its addition is small, while when it is too large the photosensitive characteristics of the resulting printing plate is poor. Therefore, it is preferred that the content of the organic compound be in the above-mentioned range.

In producing a printing plate, the above-mentioned organic compound is added in an amount of 1 to 2,000 parts by weight based on 100 parts by weight of the quinonediazide compound. It is noted in this connection that the whole amount of the organic compound which has been added is not necessarily required to be left in the photosensitive layer, and satisfactory effect can be attained when the above-mentioned amount of the organic compound is left in the photosensitive layer.

Excess amounts of the organic compound can be readily removed by evapolation. Usually they can be evapolated by heating.

The silicone rubber layer according to the present invention is composed mainly of a silicone rubber obtained by crosslinking a linear organopolysiloxane having the following repeating unit:

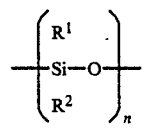

$$\left(\begin{array}{c} R^1 \\ -Si-O- \\ R^2 \end{array}\right)_n$$

wherein n stands for an integer of 2 or more and $R^1$ and $R^2$ each independently stand for a hydrogen atom, an unsubstituted or substituted (with, e.g., a halogen atom or a cyano or amino group) hydrocarbon group having 1 to 10 carbon atoms. A preferred hydrocarbon group is an alkyl, alkenyl or phenyl group, and 60% or more of the total of $R^1$ and $R^2$ are preferably methyl groups from the standpoint of easiness of production. In the present invention, the crosslinking of the organosiloxane to a silicone rubber can be attained by the condensation reaction of an organosiloxane having 1.2 or more silanol groups on the average per molecule with a crosslinking agent comprising a silane or siloxane in which two or more, preferably three or more hydrolyzable groups, e.g., acyloxy, alkoxy, ketoximate, amino or aminoxy group, halogen atom or alkenyloxy group, are bonded to the silicon atom.

Examples of the crosslinking agent having an acyloxy group include vinyltriacetoxysilane, methyltriacetoxysilane, ethyltriacetoxysilane and tetraacetoxysilane.

Examples of the crosslinking agent having an alkoxy group include tetramethoxysilane, tetraethoxysilane, methyltrimethoxysilane, methyltriethoxysilane, vinyltrimethoxysilane and vinyltriethoxysilane.

Examples of the crosslinking agent having a ketoximate group include methyltris(dimethylketoxime)silane, vinyltris(dimethylketoxime)silane, methyltris(methylethylketoxime)silane, vinyltris(methylethylketoxime)silane, tetrakis(dimethylketoxime)silane and tetrakis(methylethylketoxime)silane.

Examples of the crosslinking agent having an alkenyloxy group include methyltriisopropenoxysilane and vinyltriisopropenoxysilane.

Examples of the crosslinking agent having an amino group include methyltris(N,N-dimethylamino)silane, methyltris(N,N-diethylamino)silane, vinyltris(N,N-dimethylamino)silane, vinyltris(N,N-diethylamino)silane, 1,3,5-tris(N,N-diethylamino)-1,3,5,7,7-pentamethyltetracyclosiloxane, dimethylbis(N-methylacetamide)silane, dimethylbis(N-ethylacetamide)silane, methyltris(N-methylacetamide)silane, methyltris(N-ethylacetamide)silane, vinyltris(N-methylacetamide)silane, vinyltris (N-ethylacetamide)silane, 1,3-bis(N-methylacetamide)-1,1,3,3-tetramethyldisiloxane, 1,1,3,3-tetrakis(N-methylacetamide)-1,3-dimethyldisiloxane, a copolymer of methyl(N-methylacetamide)siloxane with dimethylsiloxane and a copolymer of methyl(N-ethylacetamide)siloxane with dimethylsiloxane.

Examples of the crosslinking agent having an aminoxy group include 1,5-bis(N,N-dimethylaminoxy)-1,3,3,5,7,7-hexamethyltetracyclosiloxane, 1,5-bis(N,N-diethylaminoxy)-1,3,3,5,7,7-hexamethyltetracyclosiloxane, 1,3,5-tris(N,N-dimethylaminoxy)-1,3,5,7,7-pentamethyltetracyclosiloxane, 1,3,5-tris(N,N-diethylaminoxy)-1,3,5,7,7-pentamethyltetracyclosiloxane, a copolymer of methyl(N,N-dimethylaminoxy)siloxane with dimethylsiloxane and a copolymer of methyl(N,N-diethylaminoxy)siloxane with dimethylsiloxane.

Examples of the crosslinking agent having a halogen atom include tetrachlorosilane, methyltrichlorosilane, dimethyldichlorosilane and vinyltrichlorosilane.

The condensates of hydrolyzates of the above-mentioned compounds may also used as the crosslinking agent.

The crosslinking may be conducted under such a condition that the number of the silanol groups of the organopolysiloxane is substantially the same as that of the hydrolyzable groups. Alternatively, the crosslinking may be conducted by hydrolysis followed by condensation under such a condition that the number of the hydrolyzable groups is larger than that of the silanol groups. It is preferred that the silicone rubber has the following composition before curing:

(a) an organopolysiloxane having 1.2 or more silanol groups on the average per molecule . . . 100 parts by weight, and
(b) a crosslinking agent having a hydrolyzable group . . . 0.5 to 20 parts by weight.

Additives such as a solvent for coating, a reinforcing filler, a catalyst for curing and a known tackifier may also be added to the composition.

Although the thickness of the silicone rubber layer is not particularly limited, too large a thickness tends to bring about lowering in developability while too small a thickness brings about lowering in strength of the plate surface. Therefore, the thickness of the silicone rubber layer is preferably 0.25 to 50 $\mu$m, more preferably 0.5 to 10 $\mu$m. An adhesive layer may be provided between the silicone rubber layer and the photosensitive layer with, e.g., a silane coupling agent or a titanium coupling agent for the purpose of ensuring adhesion.

The printing plate according to the present invention can be prepared by e.g., the following method. First, a primer layer forming composition is applied on a substrate with an ordinary coater such as a reverse roll coater, an air-knife coater or a Mayer bar coater, or a rotary applicator such as a whirler, followed by drying and, if required, heat curing, thereby forming a primer layer. If necessary, a composition for causing the migration of a quinonediazide group into the primer layer is applied and then dried. Subsequently, a photosensitive layer forming composition is applied thereon and dried and, if required, heat cured, thereby forming a photosensitive layer. If necessary, an adhesive layer is provided on the photosensitive layer, and an uncured composition of a silicone rubber is applied thereon and heat-treated for several minutes to form a silicone rubber layer. If necessary, the silicone rubber layer thus formed may be covered with a protective film comprising a polymer such as polyester or polyolefin with a laminator or the like.

The printing plate of the present invention thus prepared is exposed to an actinic light, e.g., through a negative film which has been closely contacted to the plate in vacuo. The light source used in this exposure step is one capable of generating a sufficient amount of ultraviolet rays, and examples of such a light source include a mercury lamp, a carbon arc lamp, a xenone lamp, a metal halide lamp, a tungsten lamp and a fluorescent lamp.

Thereafter, the exposed plate surface is rubbed with a developing pad containing a developer to remove at least the silicone rubber layer of the exposed portion, thereby obtaining a printing plate in which the surface of the photosensitive layer or the primer layer serves as an ink receivable image area.

Suitable developers which may be used in the production of the printing plate of the present invention are those as disclosed in U.S. Pat. No. 4,496,647 and include a developer containing a basic substance such as an amine and a developer comprising an aliphatic hydrocarbon, an aromatic hydrocarbon, water or a halogenated hydrocarbon and the following polar solvent added thereto:

(i) alcohols, e.g., methanol and ethanol,
(ii) ethers, e.g., dioxane,
(iii) cellosolve, e.g., ethyl cellosolve, methyl cellosolve and butyl cellosolve,
(iv) carbitol, e.g., methyl carbitol, ethyl carbitol and butyl carbitol, or
(v) esters, e.g., ethyl acetate, ethyl cellosolve acetate, methyl cellosolve acetate and carbitol acetate.

A printed matter having an excellent image reproduction can be obtained by mounting the printing plate thus obtained on an offset printing machine and conducting printing without use of damping water.

EXAMPLES

The present invention will now be described in more detail with reference to the following examples. In the examples, the contents in terms of % by weight of a quinonediazide group in the primer layer and the photosensitive layer of an unprocessed plate were calculated from an absorbance at a light wave length of 400 nm which were determined by reflection ultraviolet spectrometry (using a Hitachi 323 spectrophotometer). In this connection, the effective detection range of the quinonediazide group was 0.01% by weight or more.

EXAMPLE 1

The following primer composition was applied on an aluminium plate and heated at 120° C. for 4 min to form a primer layer (thickness: 1 μm):

| | | |
|---|---|---|
| (1) | a phenolic novolak resin having a number-average degree of polymerization of 5.1 | 90 parts by weight |
| (2) | a product of an esterification of the resin as mentioned in the above item (1) with 1,2-naphthoquinonediazide-5-sulfonyl chloride (percentage esterification: 25%) | 10 parts by weight |
| (3) | dibutyltin diacetate | 0.5 part by weight |
| (4) | 4,4'-diphenylmethane diisocyanate | 20 parts by weight |
| (5) | tetrahydrofuran | 990 parts by weight |

Thereafter, the following photosensitive layer composition was applied on the primer layer, heated at 120° C. for 1 min and dried to form a photosensitive layer (thickness: 1.5 g/m$^2$)

| | | |
|---|---|---|
| (1) | a product of an esterification of a phenolic novolak resin having a number-average degree of polymerization of 4.6 with 1,2-naphthoquinonediazide-5-sulfonylchloride (percentage esterification: 40%) | 20 parts by weight |
| (2) | tetrahydrofuran | 80 parts by weight |

The following adhesive layer composition was then applied on the photosensitive layer, heated at 100° C. for 1 min and dried to form an adhesive layer (thickness: 0.5 μm):

| | | |
|---|---|---|
| (1) | γ-aminopropyltrimethoxysilane | 1 part by weight |
| (2) | n-heptane | 990 parts by weight |

Subsequently, the following silicone rubber composition was applied on the adhesive layer and heated at 120° C. to dry and cure the resulting coating, thereby forming a silicone rubber layer (thickness: 2μm):

| | | |
|---|---|---|
| (1) | α,ω-dihydroxypolydimethylsiloxane (number-average molecular weight: 20,000) | 100 parts by weight |
| (2) | vinyltris(methylethylketoxime)silane | 8 parts by weight |
| (3) | dibutyltin diacetate | 0.2 parts by weight |
| (4) | n-heptane | 800 parts by weight |

Thereafter, a 10 μm-thick polypropylene film ("Torayfan," a product of Toray Industries, Inc.) was laminated as a cover film on the silicone rubber layer. Thus, there was obtained a unprocessed printing plate.

The cover film of the unprocessed printing plate thus obtained was peeled off. The silicone rubber layer, the adhesive layer and the photosensitive layer were then removed using a nonwoven fabric ("Haize Gauge," a product of Asahi Chemical Industry Ltd.) with the plate immersed in methyl ethyl ketone at 25° C., and the content of the quinonediazide group in the primer layer was determined and found to be 2.1 % by weight.

The unprocessed printing plate obtained above was exposed to an actinic light ray by means of a metal halide lamp ("Eyedolphin 2000," a product of Iwasaki Electric Co., Ltd.) for 60 sec at a distance of 1 m through a negative film having a dot image of 150 lines/in. which had been closely contacted to the plate in vacuo. The plate surface after exposure was immersed in a treating solution [ethanol/aliphatic hydrocarbon solvent ("Isopar E," a product of Exxon Corp.); 50/50 in weight ratio]. By softly rubbing the surface of the plate with a developing pad, the exposed areas were removed together with the photosensitive layer, thereby causing the primer layer to be exposed. On the other hand, the silicon rubber layer in the unexposed areas remained unremoved in a firmly bonded state, thereby exactly reproducing the image borne on the negative film.

The printing plate thus obtained was attached to an offset printing machine ("Komori Sprint 2 Color"), and printing was conducted with an ink ("Aqualess PLT Blue," a product of Toyo Ink Mfg. Co., Ltd.) without use of dampening water to obtain a printed matter having an extremely excellent image which reproduced 3% to 95% of dots of 150 lines/in.

COMPARATIVE EXAMPLE 1

An unprocessed printing plate was prepared in substantially the same manner as in EXAMPLE 1, except that the following primer composition was used instead of that used in EXAMPLE 1.

| | |
|---|---|
| (1) a phenolic novolak resin having a number-average degree of polymerization of 5.1 | 100 parts by weight |
| (2) dibutyltin diacetate | 0.5 part by weight |
| (3) 4,4'-diphenylmethane diisocyanate | 20 parts by weight |
| (4) tetrahydrofuran | 900 parts by weight |

The content of the quinonediazide group in the primer layer of the resulting unprocessed printing plate was determined in the same manner as in EXAMPLE 1 and found to be below the effective detection range, i.e., no quinonediazide group was detected in the determination.

The unprocessed printing plate was subjected to exposure and development in the same manner as in EXAMPLE 1, thereby obtaining a printing plate in which the primer layer is exposed in the light exposed areas. Using the printing plate thus obtained, printing was conducted in the same manner as in EXAMPLE 1. The resulting printed matter had an image which reproduced only 3% to 90% of dots of 150 lines/in. and was poor in the reproduction of shadow portions.

EXAMPLE 2

The following primer composition was applied on an aluminium plate and heated at 210° C. for 2 min to form a primer layer (thickness: 3 μm):

| | |
|---|---|
| (1) a polyurethane resin ("Sanprene LQ-T1331," a product of Sanyo Chemical Industry Ltd.) | 50 parts by weight |
| (2) a blocked isocyanate ("Takenate B830," a product of Takeda Chemical Industries, Ltd.) | 20 parts by weight |
| (3) an epoxy/phenol/urea resin ("SJ9372," a product of Kansai Paint Co., Ltd.) | 8 parts by weight |
| (4) N,N—dimethylformamide | 725 parts by weight |

Thereafter, the following composition was applied on the primer layer so as to form a coating having a thickness of 10 μm in a wet state and heated at 100° C. for 30 sec, thereby causing the migration of the quinoediazide compound into the primer layer:

| | |
|---|---|
| (1) a product of an esterification of a bisphenol with 1,2-naphthoquinonediazide-5-sulfonylchloride (percentage esterification: 50%) | 1 parts by weight |
| (2) tetrahydrofuran | 99 parts by weight |

The following photosensitive layer composition was then applied thereon, heated at 120° C. for 1 min and dried to form a photosensitive layer (thickness: 1.5 g/m$^2$):

| | |
|---|---|
| (1) a product of an esterification of poly(p-hydroxystyrene) having a number-average molecular weight of 11,000 with 1,2-naphthoquinonediazide-5-sulfonylchloride (percentage esterification: 40%) | 10 parts by weight |
| (2) ethyl cellosolve | 90 parts by weight |

Thereafter, an adhesive layer, a silicone rubber layes and a cover film were provided on the photosensitive layer in the same manner as in EXAMPLE 1, there by obtaining an unprocessed printing plate.

The content of the quinonediazide group in the primer layer of the resulting unprocessed printing plate was determined in the same manner as in EXAMPLE 1 and found to be 1.2% by weight.

The unprocessed printing plate thus obtained was subjected to exposure and development in the same manner as in EXAMPLE 1, thereby obtaining a printing plate in which the primer layer was exposed in the light exposed areas. Using the printing plate thus obtained, printing was conducted in the same manner as in EXAMPLE 1. The resulting printed matter had an extremely excellent image which reproduced 3% to 95% of dots of 150 lines/in.

COMPARATIVE EXAMPLE 2

The same primer layer as that formed in COMPARATIVE EXAMPLE 1 was provided on an aluminium plate. A photosensitive layer, an adhesive layer and a silicone rubber layer were successively laminated on the primer layer in the same manner as in EXAMPLE 2, thereby obtaining an unprocessed printing plate.

The content of the quinonediazide group in the primer layer of the unprocessed printing plate thus obtained was determined in the same manner as in EXAMPLE 1 and found to be below the effective detection range, i.e., no quinonediazide group was detected in the determination.

The unprocessed printing plate was subjected to exposure and development in the same manner as in EXAMPLE 1, thereby obtaining a printing plate of which the primer layer was exposed. Using the printing plate thus obtained, printing was conducted in the same manner as in EXAMPLE 1. The printed matter thus obtained had an image which reproduced only 3% to 90% of dots of 150 lines/in. and was poor in the reproduction of shadow portions.

EXAMPLE 3

The following primer composition was applied on an aluminium plate and heated at 210° C. for 2 min to form a primer layer (thickness: 7 μm):

| | | |
|---|---|---|
| (1) | a linear polyester ("Vylon 300," a product of Toyobo Co., Ltd.) | 85 parts by weight |
| (2) | a blocked diisocyanate ("Takenate B830," a product of Takeda Chemical Industries, Ltd.) | 15 parts by weight |
| (3) | N,N—dimethylformamide | 800 parts by weight |

Thereafter, the following photosensitive layer composition was applied on the primer layer, heated at 120° C. for 1 min and dried to form a photosensitive layer (thickness: 2 g/m$^2$):

| | | |
|---|---|---|
| (1) | a product of an esterification of poly(p-hydroxystyrene) having a number-average molecular weight of 11,000 with 1,2-naphthoquinonediazide-5-sulfonylchloride (percentage esterification: 25%) | 80 parts by weight |
| (2) | a product of an esterification of a phenolic novolak resin having a number-average degree of polymerization of 5.1 with 1,2-naphthoquinonediazide-5-sulfonyl chloride (percentage esterification: 25%) | 20 parts by weight |
| (3) | 4,4'-diphenylmethane diisocyanate | 30 parts by weight |
| (4) | dibutyltin diacetate | 0.2 part by weight |
| (5) | tetrahydrofuran | 500 parts by weight |

The following silicone rubber composition was applied on the photosensitive layer and heated at 120° C. for 3.5 min to dry and cure the resulting coating, thereby forming a silicone rubber layer (thicknes: 2 μm):

| | | |
|---|---|---|
| (1) | α,ω-dihydroxypolydimethylsiloxane (number-average molecular weight: 20,000) | 100 parts by weight |
| (2) | vinyltris(methylethylketoxime)silane | 8 parts by weight |
| (3) | dibutyltin diacetate | 0.2 part by weight |
| (4) | γ-aminopropyltrimethoxysilane | 0.5 part by weight |
| (5) | n-heptane | 800 parts by weight |

A cover film was laminated on the silicone rubber layer in the same manner as in EXAMPLE 1, thereby obtaining an unprocessed printing plate.

The contents of the quinonediazide group in the photosensitive layer and the primer layer of the unprocessed printing plate thus obtained were 18% by weight and 0.5% by weight, respectively, and the contents of the acetone-soluble component in the photosensitive layer and the primer layer were 28% by weight and 16% by weight, respectively.

The whole surface of the unprocessed printing plate obtained above was exposed to an actinic light having an intensisity of 11 mW/cm$^2$ with an UV meter (light measure type; "UV-402A," manufactured by Ohku Seisakusho) by means of a metal halide lamp ("Eyedolphin 2000," a product of Iwasaki Electric Co., Ltd.) for 6 sec.

Then, the unprocessed printing plate was exposed to an actinic light using the above-mentioned metal halide lamp for 60 sec at a distance of 1 m through a negative film having a dot image of 150 lines/in. which had been closely contact to the plate in vacuo. Thereafter, the cover film was peeled off and the plate after exposure was immersed in a pre-treating solution ["Isopar H" (aliphatic hydrocarbon solvent manufactured by Exxon Corp.)/butyl carbitol/ethyl cellosolve/monoethanolamine; 90/10/5/0.6 in weight ratio], and the plate surface after exposure was sufficiently wetted with the pre-treating solution for 1 min. Subsequently, the pre-treating solution on the plate surface was removed with a rubber sponge. A developer (butyl carbitol/water/2ethylbutyric acid/Crystal Violet; 20/80/2/0.2) was poured onto both the plate surface and a developing pad. By softly rubbing the surface of the plate with a developing pad, the silicone rubber layer in the image-wise exposed areas was removed, causing the surface of the photosensitive layer to be exposed. On the other hand, the silicon rubber layer in the unexposed areas remained unremoved in a firmly bonded state, thereby exactly reproducing the image borne on the negative film.

Using the printing plate thus obtained, printing was conducted in the same manner as in EXAMPLE 1. The resulting printed matter has an extremely excellent image which reproduced 3% to 98% of dots of 150 lines/in.

COMPARATIVE EXAMPLE 3

A primer layer was provided on an aluminium plate in the same manner as in Comparative EXAMPLE 1. A photosensitive layer, a silicone rubber layer and a cover film were successively laminated on the primer layer in the same manner as in EXAMPLE 3, thereby obtaining an unprocessed printing plate.

The content of the quinonediazide group in the primer layer of the unprocessed printing plate thus obtained was determined in the same manner as in EXAMPLE 1 and found to be below the effective detection range.

The unprocessed printing plate was subjected to exposure and development in the same manner as in EXAMPLE 3, thereby obtaining a printing plate in which the photosensitive layer was exposed in the light exposed areas. Using the printing plate thus obtained, printing was conducted in the same manner as in Example 1. The printed matter thus obtained had an image which reproduced 3 % to 95 % of dots of 150 lines/in. and was poorer in the reproduction of shadow portions than that of EXAMPLE 3.

EXAMPLE 4

The following primer composition was applied on a 0.3 mm-thick aluminium plate (manufactured by Sumitomo Metal Industries, Ltd.) and heated at 200° C. for 2 min to form a 5 μm-thick primer layer:

| | | |
|---|---|---|
| (1) | a polyurethane resin ("Sanprene LQ-T1331," a product of Sanyo Chemical Industry Ltd.) | 100 parts by weight |
| (2) | a blocked isocyanate ("Takenate B830,": a product of Takeda Chemical Industries, Ltd.) | 20 parts by weight |
| (3) | an epoxy/phenol/urea resin ("SJ9372," a product of Kansai Paint Co., Ltd.) | 8 parts by weight |
| (4) | dimethylformamide | 725 parts by weight |

Thereafter, the following photosensitive layer composition was applied on the primer layer with a bar coater and dried in a hot air at 110° C. for 1 min to form a photosensitive layer having a thickness of 2 g/m$^2$:

| | | |
|---|---|---|
| (1) | a product of an esterification of a phenolic novolak resin having a number-average degree of polymerization of 5.1 with 1,2-naphthoquinonediazide-5-sulfonyl chloride (percentage esterification: 25%) | 100 parts by weight |
| (2) | diethylene glycol monoethyl ether acetate (having a molecular weight of 176 and a boiling point of 217° C.) | 40 parts by weight |
| (3) | 4,4' diphenylmethane diisocyanate | 35 parts by weight |
| (4) | dibutyltin diacetate | 0.2 part by weight |
| (5) | dioxane | 800 parts by weight |

Subsequently, the same silicone rubber composition as the one used in EXAMPLE 3 was applied on the photosensitive layer and cured under heating and humid conditions at a temperature as indicated in Table 1 and thereby forming a 2.3 μm-thick silicone rubber layer.

A cover film was laminated on the silicone rubber layer in the same manner as in EXAMPLE 1 to form an unprocessed printing plate.

The content of the quinonediazide group in the primer layer of the unprocessed printing plate thus obtained was 0.7% by weight.

The unprocessed printing plate was subjected to whole surface exposure and image exposure in the same manner as in EXAMPLE 3 and subjected to developing treatment in the same manner as in EXAMPLE 3 to obtain a printing plate.

The printing plate thus obtained was attached to an offset printing machine ("Komori Sprint 2 Color"), and printing was conducted with an ink ("Aqualess PLT Blue," a product of Toyo Ink Mfg. Co., Ltd.) for the purpose of evaluating the dot reproduction. The results are shown in Table 1.

As can be seen from Table 1, the obtained printing plate exhibits an excellent dot reproduction in the range of a curing temperature from 90° C. to 115° C.

Thus, the printing plate has a wide range of silicone rubber layer curing temperatures at which it exhibits an excellent dot reproduction.

With respect to the unprocessed printing plates as prepared above, the number of the pinholes present in the photosensitive layer was counted, and the diameter thereof was determined with a magnifying glass (magnification: ×100). The results are shown in Table 2. As can be seen from Table 2, the number of pinholes in the printing plate in an unprocessed form is few and the printing plate had excellent film forming properties of the photosensitive layer over.

The amount of diethylene glycol monoethyl ether acetate remaining in the photosensitive layer after the production of the unprocessed printing plate was determined by gas chromatography. The results are shown in Table 1.

TABLE 1

| Curing temp. of silicone rubber (°C.) | Content of diethylene glycol monoethyl ether acetate after production of unprocessed printing plate (based on the photosensitive layer on a solid basis) | Dot reproduction (150 lines/in.) 1% to 99% |
|---|---|---|
| 90 | 7.7 wt % | 2 to 97 |
| 100 | 6.6 wt % | 2 to 98 |
| 105 | 6.1 wt % | 2 to 98 |
| 110 | 5.2 wt % | 2 to 98 |
| 115 | 4.1 wt % | 3 to 98 |
| 120 | 3.2 wt % | 10 to 98 |

TABLE 2

| Diameter pinhole of photosensitive layer | Number of pinholes (per m²) |
|---|---|
| 10 to 50 μm | 3 |
| 50 to 200 μm | 0 |
| 200 μm or more | 0 |

Using the printing plate which was treated by temperature of 110° C., 2,000 copies were printed under the following forced conditions to examine the resulting printed matter and the plate surface.

Printing conditions: a modified model Hamada Star - 700 direct printing machine
Printing pressure: underlay 500 μm
Ink: "Aqualess PLT Blue", a product of Toyo Ink Mfg. Co., Ltd.

With respect to the printing plate, there was observed no damage to the printing area as well as the non-printing area, and satisfactory printed matter was obtained.

EXAMPLES 5 and 6

An unprocessed printing plate was prepared in substantially the same manner as in EXAMPLE 4, except that only diethylene glycol monoethyl acetate was omitted from the printing plate of EXAMPLE 4 and that an organic compound having at least one bond selected from an ether bond and an ester bond in its molecule was added in an amount as indicated in Table 3 to form a photosensitive layer having a thickness of 2.0 g/m².

The unprocessed printing plate thus obtained was exposed and developed in the same manner as in EXAMPLE 4 to obtain a printing plate similar to that prepared in EXAMPLE 4. The printing plate was subjected to a printing evaluation test in the same manner as in EXAMPLE 4 to examine the range of silicone rubber layer curing temperatures at which the printing plate exhibits a dot reproduction of 3 to 95% (150 lines-/in.). The results are shown in Table 3.

The number of the pinholes of the photosensitive layer was counted. The results are shown in Table 3.

As can be seen from Table 3, the printing plates of EXAMPLES 5 and 6 falling within the scope of the present invention have a wide range of silicone rubber layer curing temperatures at which the printing plate exhibits a dot reproduction of 3 to 95% (150 lines/in.) and a small number of the pinholes of the photosensitive layer.

TABLE 3

| Example No. | Organic compound having at least one selected from an ether bond and an ester bond | Range of silicone rubber layer curing temps. at which printing plate exhibits a dot reproduction of 3 to 95% (150 lines/in.) | Number of pinholes of photosensitive layer (per m²) |
|---|---|---|---|
| Example 5 | diethylene glycol dimethyl ether (MW: 134) (b.p.: 160° C.) (30 pts. wt.) | 95 to 115° C. | 5 |
| Example 6 | propylene carbonate (MW: 102) (b.p.: 242° C.) (30 pts. wt.) | 100 to 115° C. | 3 |

Among the printing plates listed in Table 3, those having a silicone rubber layer curing temperature of 115° C. were selected, and 2,000 copies were printed under the same forced conditions as those of EXAMPLE 4. With respect to the printing plate obtained in EXAMPLES 5 and 6, there was observed no damage to the printing area as well as non-printing area, and satisfactory printed matter was obtained.

The following effects can be attained by the printing plate of the present invention.

(1) The addition of a quinonediazide group to the primer layer leads to prevention of halation due to active light rays passing through the photosensitive layer at the time of imagewise exposure, which improves the dot reproduction.

(2) The addition of an organic compound which has a high compatibility with a quinonediazide compound, a boiling point of 150° C. or above, at least one bond selected from an ether bond and an ester bond in its molecule and a molecular weight of 85 to 1,000 contributes to improve in the film forming properties of the photosensitive layer, which in turn widens the latitude of production.

(3) Since the photosensitive layer is flexible, cracking hardly occurs.

As is apparent from the foregoing description, a printing plate useful as a dry planographic printing plate can be provided by the present invention.

What is claimed is:

1. A printing plate in which the surface of the photosensitive layer or the primer layer serve as an ink receivable image area enabling printing without the use of dampening water, comprising a substrate and superimposed on said substrate in the following order
   (a) a primer layer, wherein said primer layer contains 0.01 to 25% by weight, based on the total weight of the primer layer, of a compound containing a photosensitive o-quinoediazide group,
   (b) a photosensitive layer containing an o-quinonediazide compound, and wherein after processing the surface of the photosensitive layer or the primer layer serves as an ink receivable image area, and
   (c) a silicone rubber layer.

2. A printing plate according to claim 1, wherein said quinonediazide group is contained in said primer layer in an amount of 0.01 to 10% by weight, based on the total weight of the primer layer.

3. A printing plate according to claim 1, wherien said quinonediazide group is contained in said primer layer in an amount of 0.1 to 5% by weight, based on the total weight of the primer layer.

4. A printing plate according to claim 1, wherein said quinonediazide group is a naphthoquinonediazide group.

5. A printing plate according to claim 1, wherein said photosensitive layer has a thickness of 0.3 to 10 g/m².

6. A printing plate according to claim 1, wherein said primer layer has a thickness of 0.5 to 100 μm.

7. A printing plate according to claim 1, wherein said photosensitive layer contains an acetone-soluble component in an amount of 20% by weight or more, and said primer layer contains an acetone-soluble component in an amount of less than 20% by weight.

8. A printing plate according to claim 1, wherein said photosensitive layer contains an organic compound which has a boiling point of 150° C. or above, at least one bond selected from an ether bond and an ester bond and a molecular weight of 85 to 1,000.

9. A printing plate according to claim 8, wherein said organic compound having at least one bond selected from an ether bond and an ester bond is contained in said photosensitive layer in an amount of 0.5 to 150 parts by weight per 100 parts by weight, on a dry basis, of said photosensitive layer.

10. A printing plate according to claim 8, wherein said organic compound is at least one member selected from the group consisting of the compounds represented by the following formulae (I) and (II):

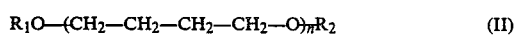

wherein $R_1$ and $R_2$ each independently stand for a hydrogen atom, an alkyl group having 1 to 10 carbon atoms or an acyl group having 2 to 5 carbon atoms; $R_3$ a hydrogen atom or a methyl group; and n an integer of 2 to 15.

* * * * *

UNITED STATES PATENT AND TRADEMARK OFFICE
CERTIFICATE OF CORRECTION

PATENT NO.  : 4,853,313

DATED       : August 1, 1989

INVENTOR(S) : Yoichi Mori, et al.

It is certified that error appears in the above-identified patent and that said Letters Patent is hereby corrected as shown below:

Column 11, line 44, "quinoediazide" should read as --quinonediazide--

Column 18, line 48, Claim 3: "wherien" should read as --wherein--

Signed and Sealed this

First Day of January, 1991

Attest:

HARRY F. MANBECK, JR.

Attesting Officer

Commissioner of Patents and Trademarks